United States Patent
Vijayakumar et al.

(10) Patent No.: US 11,878,906 B2
(45) Date of Patent: Jan. 23, 2024

(54) METHOD FOR MANUFACTURING AN INTEGRATED MEMS TRANSDUCER DEVICE AND INTEGRATED MEMS TRANSDUCER DEVICE

(71) Applicant: Sciosense B.V., AE Eindhoven (NL)

(72) Inventors: Kailash Vijayakumar, KN Eindhoven (NL); Remco Henricus Wilhelmus Pijnenburg, AE Hoogeloon (NL); Willem Frederik Adrianus Besling, JN Eindhoven (NL); Sophie Guillemin, AE Eindhoven (NL); Jörg Siegert, AE Eindhoven (NL)

(73) Assignee: Sciosense B.V., AE Eindhoven (NL)

( * ) Notice: Subject to any disclaimer, the term of this patent is extended or adjusted under 35 U.S.C. 154(b) by 0 days.

(21) Appl. No.: 17/937,123

(22) Filed: Sep. 30, 2022

(65) Prior Publication Data
US 2023/0036935 A1    Feb. 2, 2023

Related U.S. Application Data

(62) Division of application No. 17/288,267, filed as application No. PCT/EP2019/080091 on Nov. 4, 2019, now Pat. No. 11,492,251.

(30) Foreign Application Priority Data

Nov. 19, 2018  (EP) .................................. 18207101

(51) Int. Cl.
*B81C 1/00* (2006.01)

(52) U.S. Cl.
CPC ...... *B81C 1/00476* (2013.01); *B81C 1/00595* (2013.01); *B81B 2201/0257* (2013.01);
(Continued)

(58) Field of Classification Search
None
See application file for complete search history.

(56) References Cited

U.S. PATENT DOCUMENTS 5,366,587 A   11/1994  Ueda et al.
8,643,129 B2   2/2014  Laming et al.
(Continued)

FOREIGN PATENT DOCUMENTS

CN  101631739 A  1/2010
CN  106794981 A  5/2017
(Continued)

*Primary Examiner* — Shamim Ahmed
(74) *Attorney, Agent, or Firm* — Slater Matsil, LLP

(57) ABSTRACT

In an embodiment, an integrated MEMS transducer device includes a substrate body having a first electrode on a substrate, an etch stop layer located on a surface of the substrate, a suspended micro-electro-mechanical systems (MEMS) diaphragm with a second electrode, an anchor structure with anchors connecting the MEMS diaphragm to the substrate body and a sacrificial layer in between the anchors of the anchor structure, the sacrificial layer including a first sub-layer of a first material, wherein the first sub-layer is arranged on the etch stop layer, a second sub-layer of a second material, wherein the second sub-layer is arranged on the first sub-layer, and wherein the first and the second material are different materials.

16 Claims, 4 Drawing Sheets

(52) U.S. Cl.
CPC . *B81B 2201/0264* (2013.01); *B81C 2201/014* (2013.01); *B81C 2201/0132* (2013.01); *B81C 2201/053* (2013.01)

(56) References Cited

U.S. PATENT DOCUMENTS

| | | | |
|---|---|---|---|
| 8,679,354 | B2 | 3/2014 | O'Hara |
| 8,833,171 | B2 | 9/2014 | Besling et al. |
| 9,061,895 | B2 | 6/2015 | Robert et al. |
| 9,340,412 | B2 | 5/2016 | Besling et al. |
| 9,557,238 | B2 | 1/2017 | Besling et al. |
| 9,772,245 | B2 | 9/2017 | Besling et al. |
| 2003/0006468 | A1 | 1/2003 | Ma et al. |
| 2003/0071015 | A1 | 4/2003 | Chinn et al. |
| 2004/0077119 | A1 * | 4/2004 | Ikeda ............... B81C 1/00611 438/48 |
| 2005/0250235 | A1 | 11/2005 | Miles et al. |
| 2008/0157625 | A1 | 7/2008 | Horng et al. |
| 2009/0258455 | A1 | 10/2009 | Cotte et al. |
| 2011/0111545 | A1 * | 5/2011 | El-Gamal ........... B81C 1/00587 257/E21.002 |
| 2012/0057216 | A1 | 3/2012 | Flores et al. |
| 2013/0062710 | A1 * | 3/2013 | Dehe ................ B81C 1/00476 257/E21.001 |
| 2013/0129118 | A1 | 5/2013 | Mao et al. |
| 2013/0214274 | A1 | 8/2013 | Mertz et al. |
| 2014/0053651 | A1 | 2/2014 | Besling et al. |
| 2016/0145094 | A1 | 5/2016 | Lee et al. |
| 2020/0103290 | A1 | 4/2020 | Hung et al. |
| 2020/0137501 | A1 | 4/2020 | Piechocinski |

FOREIGN PATENT DOCUMENTS

| | | |
|---|---|---|
| EP | 0518112 A1 * | 12/1992 |
| EP | 2682363 A1 | 1/2014 |
| FR | 2954505 A1 | 6/2011 |
| TW | 200827287 A | 7/2008 |
| TW | 201619040 A | 6/2016 |
| TW | 201838908 A | 11/2018 |

* cited by examiner

METHOD FOR MANUFACTURING AN INTEGRATED MEMS TRANSDUCER DEVICE AND INTEGRATED MEMS TRANSDUCER DEVICE

CROSS-REFERENCE TO RELATED APPLICATIONS

This is a divisional application of U.S. application Ser. No. 17/288,267 entitled "Method for Manufacturing an Integrated MEMS Transducer Device and Integrated MEMS Transducer Device," which was filed on Apr. 23, 2021, which is now U.S. Pat. No. 11,492,251 and issued on Nov. 8, 2022, which is a national phase filing under section 371 of PCT/EP2019/080091, filed Nov. 4, 2019, which claims the priority of European patent application 18207101.9, filed Nov. 19, 2018, all of which is incorporated herein by reference in its entirety.

TECHNICAL FIELD

The present disclosure relates to a manufacturing method of integrated MEMS transducers such as parallel plate capacitive transducers.

BACKGROUND

MEMS sensors are commonly employed in a wide range of applications such as automotive, consumer, industrial and medical, as well as many other applications. MEMS devices typically comprise a suspended object which is formed by removal of a sacrificial layer towards the end of the manufacturing process. Suspending an object requires well-controlled etching in order to remove the sacrificial layer. Commonly, for suspending components of a MEMS device a sacrificial material subjacent to the component to be suspended is removed through hydrofluoric acid, HF, in particular through a HF vapor etch.

SUMMARY

Embodiments provide an improved method for manufacturing an integrated MEMS transducer device with low power requirements and high sensitivity.

Typically, sacrificial layers for fabricating a MEMS device consist of a single material such as silicon dioxide, $SiO_2$, that is removed by employing HF vapor, vHF, as an etchant. During this process, a catalyst, which usually is water or alcohol, is added in order to ionize the HF vapor and as a consequence to initiate and to maintain the etching of the sacrificial material:

$$SiO_2 + 2HF_2^- + 2AH^+ \rightarrow SiH_4 + 2H_2O + 2A$$

As is identifiable from the reaction equation above with Alcohol A as a catalyst, even though vHF etching constitutes a dry etching process, water, $H_2O$, is formed as a byproduct of the reaction. This water likewise acts as a catalyst for the etching process:

$$2HF + H_2O \rightarrow H_3O^+ + HF_2^-$$

$$SiO_2 + 2H_3O^+ + 2HF_2^- \rightarrow SiF_4 + 4H_2O$$

In order to prevent an uncontrolled etch and hence to achieve an optimal etch result avoiding non-uniformities in etched surfaces, the amount of water formed during the entire etching process must be well controlled.

A conventional approach suggests the sacrificial layer removal at high temperatures which, however, reduces the etch selectivity between the sacrificial material and that of an etch-stop layer, ESL, which is typically employed for terminating the etching process and thus preventing unwanted etching of other layers and/or materials. This leads to thick ESLs being required in order to avoid over-etching, which limit the sensitivity of the MEMS transducer as the ESL typically remains on the finalized product for protective purposes.

An alternative conventional approach is the employment of sacrificial layer materials that are characterized by a low moisture content and a low etch rate such that only a small amount of water is formed during the etching process. However, this approach leads to a decreased production volume and higher manufacturing costs.

To overcome the limitations of conventional manufacturing methods, the improved method is based on the idea to suspend an object of the transducer, such as a diaphragm or a membrane, by means of removing a sacrificial layer that comprises sub-layers of different materials. These materials are chosen such that an optimal trade-off is achieved between water formed during the etching process and the etching duration, wherein parameters of the etching process itself, such as temperature and/or HF concentration, are maintained compared to a conventional unilayer sacrificial layer removal.

The method for manufacturing a MEMS transducer device according to the improved method comprises providing a substrate body with a surface and depositing an etch-stop layer, ESL, on the surface. The method further comprises depositing a sacrificial layer on the ESL, depositing a diaphragm layer on the sacrificial layer, and removing the sacrificial layer. Therein, depositing the sacrificial layer comprises depositing a first sub-layer of a first material and depositing a second sub-layer of a second material, wherein the first and the second material are different materials.

The substrate body, for example, comprises a substrate of semiconductor such as silicon and may comprise active circuitry, for example an application-specific integrated circuit, ASIC, for readout purposes arranged on a surface or partially or completely within the substrate.

The etch-stop layer, ESL, is of a material with a lower etch rate regarding an HF etch, for example a dielectric such as Si-rich silicon nitride, silicon carbide, silicon carbonitride or aluminum oxide, and is deposited on a surface of the substrate body. In order to maintain sufficient sensitivity, the ESL is typically deposited with a thickness of 20 to 500 nm in a vertical direction perpendicular to the surface of the substrate body.

The sacrificial layer is deposited on the ESL, i.e. on a surface of the ESL facing away from the substrate body, and comprises a first and a second material that have a high selectivity compared to the material of the ESL regarding a vHF etch, i.e. a significantly higher etch rate compared to the material of the ESL such as silicon-rich SiN. The first and the second material of the sacrificial layer may differ from each other such that the etching behavior during removal of the sacrificial layer differs for the first and the second material. For example, the etch rate or the isotropicity of the etching is different. The first and the second material differ from each other in terms of composition, moisture content and/or density, for instance.

The diaphragm layer comprises the object to be suspended and is deposited on the sacrificial layer, i.e. on a surface of the sacrificial layer facing away from the substrate body. For example, the object to be suspended is a MEMS membrane and comprises an electrode, such as a top electrode, of a capacitive MEMS transducer. Compared to conventional piezo-resistive transducers, capacitive transducers are characterized by low power consumption and high sensitivity and accuracy. The diaphragm layer therefore may comprise an electrically conductive material such as metals like tungsten, titanium and titanium nitride. In this context 'top electrode' refers to the electrode of a transducer arranged at the largest distance from the substrate body in a vertical direction perpendicular to a main extension plane of the substrate body. The distance is determined by the combined thickness of the ESL and the sacrificial layer and is typically in the order of 200 nm to 5 μm.

In contrast to conventional transducer devices that employ Si-based diaphragms, which have to be manufactured separately from the readout circuit due to the temperature requirements, an advantage of the suggested materials enables a combined monolithic CMOS-compatible fabrication of the entire transducer device without the requirement of bonding wires that may produce additional noise and therefore limit the sensitivity.

Manufacturing a MEMS transducer device following the improved method enables a well-controlled removal of the sacrificial layer for suspension of the diaphragm and therefore prevents over-etching of the ESL which may result in possible exposure of underlying structures and materials.

In some embodiments, the first sub-layer is deposited on the ESL and the second sub-layer is deposited on the first sub-layer.

In this configuration, the etchant that usually attacks the surface of the sacrificial layer facing the diaphragm layer, for example through openings in the diaphragm layer, first removes the second sub-layer before being able to etch the first sub-layer. This arrangement of the first and the second sub-layers forming a stack therefore further increases the control over the etching process as thicknesses of the first and the second sub-layer may be predetermined in order to optimize the etching of the first and the second sub-layer for a specific transducer design.

In some embodiments, the first and the second material are dielectrics such as oxides.

Like the aforementioned material choices for the ESL, oxides such as silicon dioxide are CMOS-compatible materials, which provide the required high selectivity compared to the material of the ESL regarding an HF-based etch. In a vHF etching process, silicon dioxide is characterized by a 20 to 100 times higher etch rate compared to silicon-rich silicon nitride, for instance. This allows for efficient removal of the sacrificial layer without the necessity of providing a thick ESL in order to prevent over-etching. For example, a thickness of the ESL is an order of magnitude smaller than a thickness of the sacrificial layer.

In some embodiments, the first and the second material differ from each other in terms of an etch rate regarding a release etchant such as vHF or water-based HF acid.

The different etch rates of the first and the second material provide a trade-off between the well-controlled removal of the sacrificial layer and an acceptable total etching time required to remove the entire sacrificial layer. The different etch rates are realized by different moisture contents or densities of the first and the second material, for instance. The denser material or the material with the lower moisture content produces less water as a by-product and therefore leads to a lower etch rate compared to the material with the higher moisture content or the lower density material. Moreover, the material with the lower moisture content or higher density may be etched more isotropically compared to the material with the higher moisture content or lower density due to less water being formed and acting as a catalyst leading to an uncontrolled etching behavior.

In some embodiments, the second material is an undoped silica glass, USG.

Undoped silica glass, deposited by low density CVD techniques, contains significant moisture content leading to a high etch rate once the etching process is initiated. In embodiments, in which the etchant attacks the second sub-layer before the first sub-layer, a USG as the second material may lead to a fast removal of the second sub-layer before the etch becomes well-controlled during the removal of the first sub-layer. Furthermore, water residues left after removal of the second sub-layer may increase the initial etch rate of the first material, which has a low moisture content or higher density, for example.

In some embodiments, the first material is a fluorinated silica glass, FSG, or a silica glass being deposited via high-density plasma chemical vapor deposition, HDP-CVD.

A PECVD deposited doped silica glass, such as FSG that has a fluorine dopant concentration of around 3.5% and is typically used as a low-κ dielectric, and an HDP-CVD deposited silica glass are two alternatives to achieve a deposited dielectric layer with low moisture content and high density. In embodiments, in which the first sub-layer is deposited on the ESL and therefore etched last, such a slow etching first material leads to a well-controlled etch behavior during the final stage of removing the sacrificial layer. Compared to USG, for example, a release etch of FSG or HDP-CVD deposited silica is significantly more isotropic and therefore prevents non-uniformities of the ESL after the release etch.

In some embodiments, the sacrificial layer is deposited with a thickness of the sacrificial layer in a vertical direction, which is perpendicular to the main plane of extension of the substrate body, of equal to or less than 5 μm, in particular equal to or less than 1 μm.

As mentioned above, typically the distance of the diaphragm from the surface of the substrate body is in the order of merely a few micrometers in order to maintain a sufficiently large sensitivity of the transducer device. As it is desirable that the ESL is as thin as possible, e.g., significantly thinner than 1 μm, said distance is substantially determined by the thickness of the sacrificial layer. For a sacrificial layer of 1 μm thickness, the first sub-layer may have a thickness of 650 nm and the second sub-layer may have a thickness of 350 nm, for instance, in order to achieve the aforementioned trade-off.

In some embodiments, depositing the sacrificial layer further comprises depositing a third sub-layer of a third material, wherein the third material is different from the first and the second material, or corresponds to the first material.

Some material choices of the diaphragm layer, for example titanium or titanium nitride, are not entirely resistant to HF-based acids, such that the diaphragm layer may be attacked during the sacrificial layer removal. To prevent the etching of the diaphragm layer, a third sub-layer of a material with a low etch rate may be deposited such that the diaphragm layer is deposited on said third layer. The third material, like the first material, is an FSG or a HDP-CVD deposited silica, for example. To maintain the material list of the manufacturing process as short as possible, the third material ideally corresponds to the first material and has a likewise low moisture content and higher density.

In some embodiments, the substrate body comprises a passivation layer and/or an electrode layer, and the surface is a surface of the passivation layer and/or the electrode layer.

The bottom electrode of a capacitive transducer, i.e. the electrode arranged closest to the substrate body, may be realized by depositing, patterning and structuring an electrode layer, for example comprising a metallic material, such that the ESL is deposited on the surface of the electrode layer 5 facing away from the substrate body. In order to prevent short-circuits, a passivation layer may in addition be deposited on the substrate body. For example, the passivation layer comprises a dielectric material.

In some embodiments, the method further comprises patterning and structuring the diaphragm layer, in particular prior to removing the sacrificial layer.

In order for the vHF etchant to be able to attack the top surface of the sacrificial layer, openings in the diaphragm may be formed, for example to create a perforated membrane. These openings may be designed in terms of size, shape and spacing, for instance, to adjust the etching behavior of the sacrificial layer. Said openings therefore act as inlet ports of the etchant.

In some embodiments, depositing the diaphragm layer comprises depositing an adhesion layer.

As some materials, such as tungsten, are characterized by a low adhesion to other materials such as oxides, the adhesion can be promoted by an additional adhesion layer, for example comprising titanium and/or titanium nitride. To this end, depositing the diaphragm layer comprises depositing the adhesion layer on the sacrificial layer, followed by depositing a layer of tungsten, for instance, which is used as the top electrode in a capacitive transducer due to its electric conductivity.

The object is further solved by an integrated MEMS transducer device fabricated after the method according to one of the embodiments described above. The device comprises the substrate body having a first electrode on a substrate, a suspended MEMS diaphragm with a second electrode and an anchor structure with anchors connecting the MEMS diaphragm to the substrate body.

The anchor structure, for example, comprises vias or trenches for electrically interconnecting the second electrode, i.e. the top electrode, with active circuitry arranged on or within the substrate body.

In some embodiments, the integrated MEMS transducer device further comprises the sacrificial layer in between the anchors of the anchor structure.

Spacings inside the anchor structure are inaccessible for the etchant during the sacrificial layer removal. The finalized transducer device in these embodiments therefore possesses residues of the sacrificial layer comprising the material stack of the sub-layers.

Further embodiments of the integrated MEMS transducer device become apparent to the skilled person in the art from the embodiments of the manufacturing method described above.

The object is further solved by a pressure sensor comprising an integrated MEMS transducer device according to one of the embodiments described above.

The object is further solved by an electronic device comprising a pressure sensor with an integrated MEMS transducer device according to one of the embodiments described above.

Applications of the integrated transducer device manufactured after the improved method include environmental sensors such as capacitive CMOS pressure sensors, dynamic pressure transducers employed as microphones and/or speakers in the audio band and for ultrasound applications. Furthermore, said transducers may be employed in microhotplates and for infrared-detection. Electronic devices, in which the integrated transducer devices may be employed, include mobile communication devices such as smartphones and tablet computers, but also wearable devices like smartwatches.

BRIEF DESCRIPTION OF THE DRAWINGS

The following description of figures of exemplary embodiments may further illustrate and explain aspects of the improved method. Components and parts of the integrated transducer device with the same structure and the same effect, respectively, appear with equivalent reference symbols. In so far as components and parts of the transducer device correspond to one another in terms of the function in different figures, the description thereof is not repeated for each of the following figures.

DETAILED DESCRIPTION OF ILLUSTRATIVE EMBODIMENTS

FIGS. 1A to 1E show cross sections of intermediate steps of an exemplary manufacturing method of an integrated transducer device. In this embodiment, depositing the sacrificial layer 3 comprises depositing a first sub-layer 4 and a second sub-layer 5.

Figure 1A:
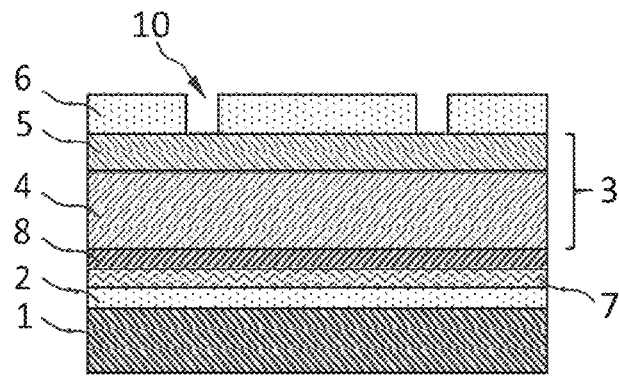
FIGS. 1A to 1E show cross sections of intermediate steps of an exemplary embodiment of the improved manufacturing method of an integrated transducer device.

FIG. 1A shows a cross section of an intermediate product of a transducer device before the release etch. The integrated transducer device comprises a substrate body 1 of a substrate material, which may be silicon. The substrate body 1 may also comprise an integrated circuit, which may in particular be a CMOS circuit with active and passive circuitry. Such integrated circuits are known per se, and are not shown in the figures. The integrated circuit may especially be provided for an evaluation of signals from the transducer, such as a capacitance of the transducer.

A cover layer 2, which may include a wiring embedded in an inter-metal dielectric layer and/or a passivation, for instance, is applied on a surface of the substrate body 1. The inter-metal dielectric layer may comprise silicon dioxide, and the passivation may comprise a combination of silicon dioxide and silicon nitride, for instance. The part of the transducer device that includes the substrate body 1 and the cover layer 2 may be similar to a conventional semiconductor device with an integrated circuit. The transducer device differs from such a semiconductor device by an arrangement of transducer elements on a surface of the cover layer 2 facing away from the semiconductor body 1. A thickness of the cover layer 2 may be in the order of 100 nm-5 μm, or even 100-200 nm.

An electrode layer 7 may be arranged on the surface of the cover layer 2 facing away from the substrate body 1 and patterned and structured, for example via lithography and etching, in order to form a first electrode of a transducer, especially a capacitive transducer, for instance. The first electrode of such a transducer may be referred to as the bottom electrode. An etch-stop layer, ESL, 8 is arranged on a surface of the electrode layer 7 facing away from the substrate body 1. Thicknesses of the electrode layer 7 and the ESL 8 may be in the order of 20-500 nm, or even 50-300 nm.

A sacrificial layer 3 is arranged on a surface of the ESL 8 facing away from the substrate body 1. The ESL 8 is made of a material with a significantly lower etch rate regarding a fluorine-based etchant compared to a material of the sacrificial layer 3. For example, the ESL 8 comprises silicon nitride, such as silicon-rich silicon nitride, while the sacrificial layer 3 comprises silicon or silicon dioxide. The sacrificial layer 3 comprises a first and a second sub-layer 4, 5, wherein the first sub-layer is of a first material and arranged on the surface of the ESL 8 and the second sub-layer 5 is of a second material and arranged on the first sub-layer 4. The first material may be fluorinated silica glass, FSG, which is characterized by a low moisture content compared to the second material, which may be an undoped silica glass, USG, for instance. A total thickness of the sacrificial layer may be in the order of 200 nm-5 μm, or even 500 m to 3 μm.

A diaphragm layer 6 is deposited on a surface of the sacrificial layer 3 facing away from the substrate body 1 and patterned and structured in a subsequent step for forming openings 10. The diaphragm layer 6 may comprise a sequence of layers and may particularly include a main layer and an adhesion layer. The latter is configured to facilitate the arrangement of the diaphragm layer 6 on the sacrificial layer 3. A material of the adhesion layer may be characterized by a larger adhesion to the sacrificial layer 3 compared to a material of the main layer. The adhesion layer may for example comprise titanium, titanium nitride, TiN, or a combination of titanium and TiN. The main layer may be a metal such as tungsten. The thickness of the diaphragm layer 6 may be in the order of 50 nm-2 μm, or even 50-300 nm. Parameters, such as size and spacing, of the openings 10 have to be considered when choosing both thicknesses of the first and the second sub-layer 4, 5 of the sacrificial layer 3, as this may influence the etching process.

In the following FIGS. 1B to 1E, the labeling is omitted for illustration purposes. The shading of the respective layers is kept consistent throughout all figures.

Figure 1B:
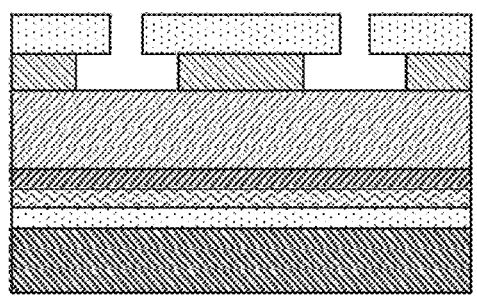

FIG. 1B shows a cross section of the intermediate product according to FIG. 1A after initiating the release by introducing the vHF etchant through the openings 10 of the diaphragm layer 6. As the second sub-layer 5 possesses significantly higher moisture content compared to the first sub-layer 4, the etch rate for the former is significantly higher.

Figure 1C:
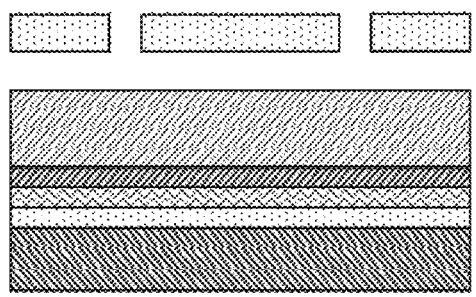

FIG. 1C shows a cross section of the intermediate product according to FIG. 1B after the second sub-layer 5 has been completely removed. Due to the low moisture content, the first sub-layer 4 shows, if at all, only minor decrease in thickness due to the etch. Since the diaphragm layer 6 is fully released already at this point, the vHF etchant is able to attack the entire surface of the first sub-layer 4 facing away from the substrate body 1 enabling an isotropic etch, as illustrated in FIG. 1E, which shows a first sub-layer 4 with reduced thickness.

Figure 1D:
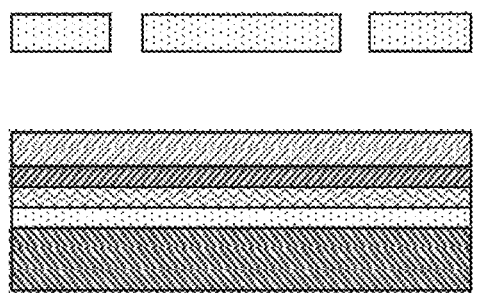
Figure 1E:
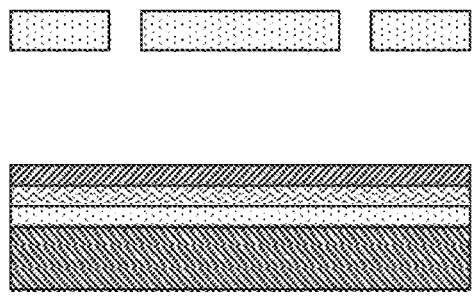

FIG. 1E shows a cross section of the intermediate product according to FIG. 1D after also the first sub-layer 4, and therefore the entire sacrificial layer 3, has been completely removed. The ESL 8 remains on the finalized transducer and serves as protective layer for the otherwise exposed electrode layer 7.

In contrast to the embodiment shown in FIGS. 1A to 1E, a reverse order of the sub-layers 4, 5 is likely possible. This case, in which the first sub-layer 4 is characterized by a faster etch rate compared to the second sub-layer 5 regarding a specific etchant, may be employed if protection of the diaphragm layer has to be considered, while the ESL 8 may have a high enough selectivity such that a well-controlled etch is not crucial at this point. For example, the first sub-layer 4 may in this embodiment comprise USG and the second sub-layer 5 may comprise FSG. The thicknesses of the sub-layers 4, 5 in this embodiment may be tailored to the specific design and/or manufacturing process.

FIGS. 2A to 2F show cross sections of intermediate steps of a further exemplary manufacturing method of an integrated transducer device. Compared to FIGS. 1A to 1E, in this embodiment, depositing the sacrificial layer 3 further comprises depositing a third sub-layer 9 on the second sub-layer 5.

Figure 2A:
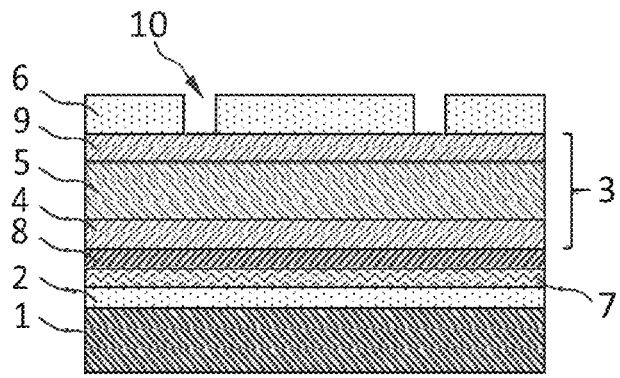
FIGS. 2A to 2F show cross sections of intermediate steps of a further exemplary embodiment of the manufacturing method of an integrated transducer device.

FIG. 2A, analogous to FIG. 1A, shows a cross section of an intermediate product of a transducer device before initiating the release etch. This embodiment is particularly relevant if the diaphragm layer comprises an adhesion layer of Ti and or TiN, for example. The adhesion layer not only promotes adhesion of the main layer to the sacrificial layer 3, but Titanium also acts as a getter material that reduces the partial pressure of hydrogen in the cavity, i.e. the void between the ESL 8 and the diaphragm layer 6. For this reason, etching of the adhesion layer and consequent formation of $TiF_4$ residues should be avoided. To this end, the third material of the third sub-layer 9 like the first sub-layer 4 is characterized by a low moisture content resulting in a low etch rate. For example, the first and the third material is HDP-CVD silica glass.

In the following FIGS. 2B to 2F, the labeling is omitted for illustration purposes. The shading of the respective layers is kept consistent throughout all figures.

Figure 2B:
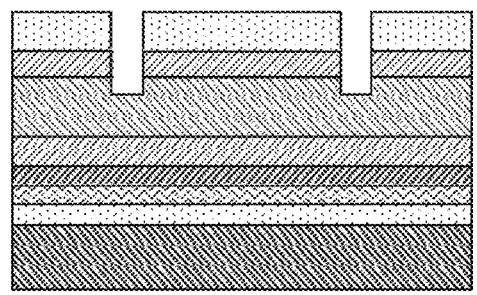
Figure 2C:
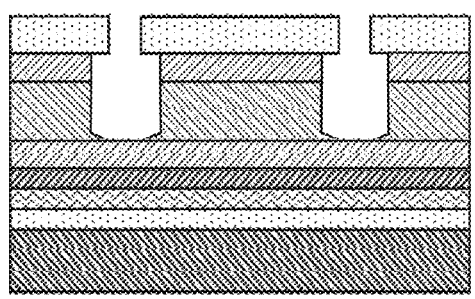
Figure 2D:
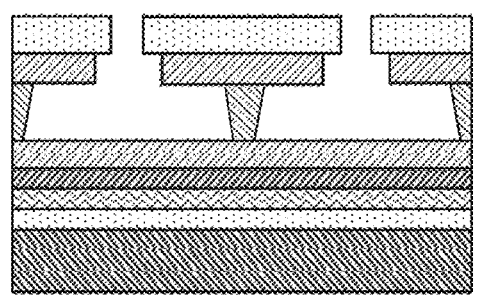

FIG. 2B shows a cross section of the intermediate product according to FIG. 2A after initiating the release by introducing the vHF etchant through the openings 10 of the diaphragm layer 6. After etching through the third sub-layer 9, the second sub-layer 5, comprising USG, is preferentially etched, as also illustrated in FIGS. 2C and 2D. Due to this preferential etching, the third sub-layer 9 substantially covers the diaphragm layer 6 after the second sub-layer 5 has been completely removed.

Figure 2E:
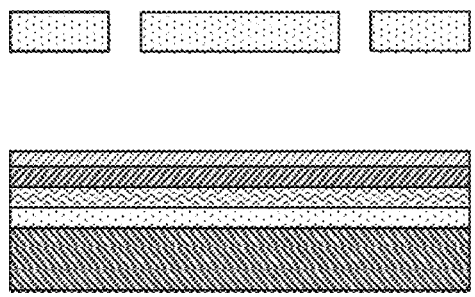

FIG. 2E shows a cross section of the intermediate product according to FIG. 2D after the second and the third sub-layer 5, 9 have been completely removed and the thickness of the first sub-layer 4 is significantly decreased.

Figure 2F:
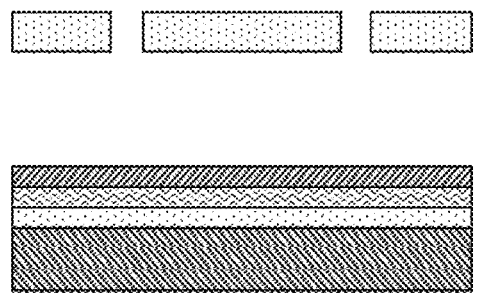

FIG. 2F shows a cross section of the intermediate product according to FIG. 2E after also the first sub-layer 4, and therefore the entire sacrificial layer 3, has been completely removed. Like in the embodiment of FIG. 1E, the ESL 8 remains on the finalized transducer.

Figure 3:
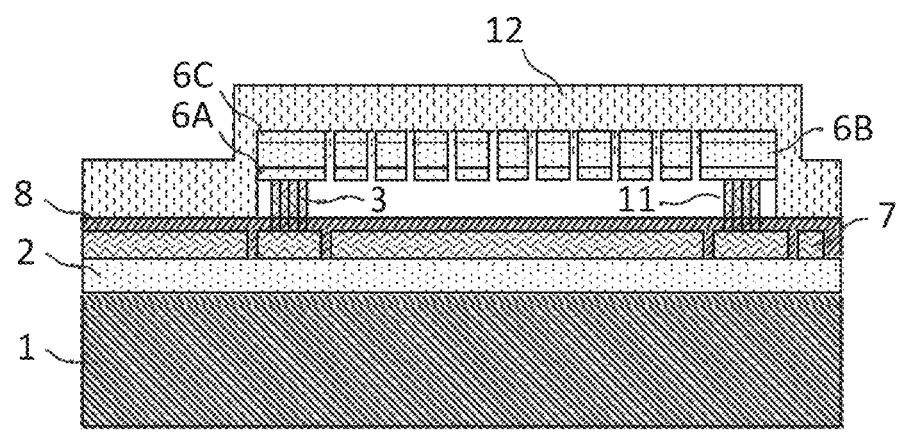
FIG. 3 shows a cross section of a finalized integrated transducer device manufactured with the improved method.
Figure 4A:
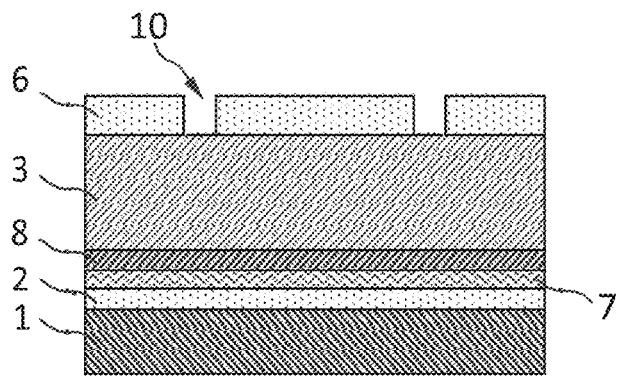
FIGS. 4A to 4E show cross sections of intermediate steps of a conventional manufacturing method of an integrated transducer device.
Figure 4B:
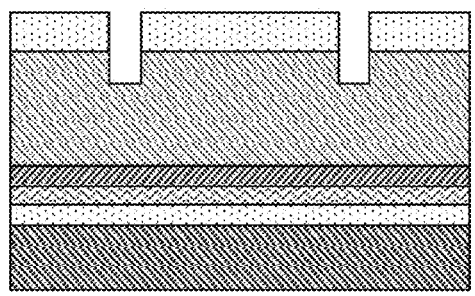
Figure 4C:
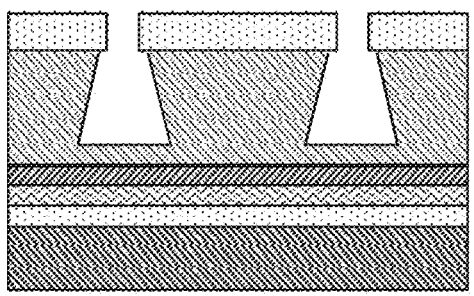
Figure 4D:
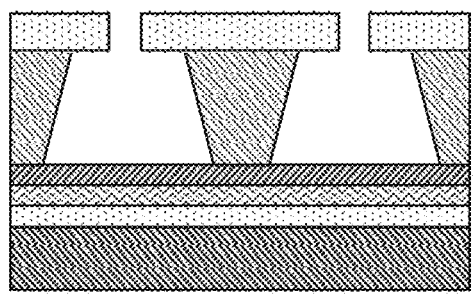
Figure 4E:
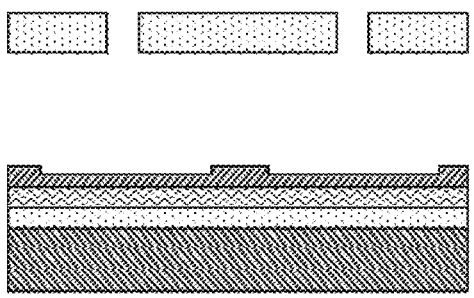

FIG. 3 shows a cross section of a finalized integrated transducer device manufactured after an embodiment of the improved method. The transducer device comprises a structured electrode layer 7 arranged on a cover layer 2, with the electrode layer 7 forming a bottom electrode of the transducer and contacts for the diaphragm layer 6. The electrode layer is completely covered with an ESL 8 facing away from the substrate body 1 owing to the improved manufacturing method described in the previous figures. The diaphragm layer 6 constitutes a perforated MEMS membrane, for example, having a main layer 6B arranged in between an adhesive layer 6A and a protective layer 6C, protecting the main layer 6B during the release etch on both surfaces of the main layer 6B. The diaphragm layer 6 is interconnected with contact pads of the electrode layer and/or contacts of circuitry of the substrate body, for instance belonging to an integrated circuit, via anchors 11 of an anchor structure.

As the sacrificial layer 3 in between individual anchors is sealed from the cavity that is delimited by the ESL 8, the diaphragm layer 6 and the anchor structure, the release etch does not remove said portion of the sacrificial layer 3, which therefore remains in between said anchors in the finalized transducer. The FIG. 3 further shows a cap layer 12 deposited after the release etch serving as a protective layer of the transducer.

FIGS. 4A to 4E FIGS. 2A to 2F show cross sections of intermediate steps of a conventional manufacturing method of an integrated transducer device. The conventional method employs a sacrificial layer 3 consisting of a single unilayer, for example of USG. The procedure of the release etch is analogous to that shown in FIGS. 1A to 1E and 2A to 2F. The unilayer results in an anisotropic etch, i.e. faster etching in a vertical direction towards the substrate body 1 compared to the etch rate in lateral direction parallel to a main plane of extension of the substrate body 1. This anisotropic etch results in an uneven removal of the sacrificial layer and may cause uneven removal of the ESL 8, which may in turn influence the capacitance between the top and bottom electrode and hence decrease the sensitivity.

The embodiments shown in the FIGS. 1A to 3 as stated represent exemplary embodiments of the improved manufacturing method and the integrated transducer device, therefore they do not constitute a complete list of all embodiments according to the improved method. Actual transducer device configurations may vary from the embodiments shown in terms of shape, size and materials, for example.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. An integrated MEMS transducer device comprising:
   a substrate body having a first electrode on a substrate;
   an etch stop layer located on a surface of the substrate;
   a suspended micro-electro-mechanical systems (MEMS) diaphragm with a second electrode;
   an anchor structure with anchors connecting the MEMS diaphragm to the substrate body; and
   a sacrificial layer in between the anchors of the anchor structure, the sacrificial layer comprising:
      a first sub-layer of a first material, wherein the first sub-layer is arranged on the etch stop layer, and
      a second sub-layer of a second material, wherein the second sub-layer is arranged on the first sub-layer, and
      wherein the first and the second material are different materials.

2. The integrated MEMS transducer device according to claim 1, wherein the first material comprises at least one of a lower moisture content or a higher density compared to the second material.

3. The integrated MEMS transducer device according to claim 1, wherein the first and the second material differ from each other in terms of an etch rate regarding vapor hydrofluoric acid or water-based HF acid.

4. The integrated MEMS transducer device according to claim 1, wherein the first and the second material are dielectrics.

5. The integrated MEMS transducer device according to claim 1, wherein the first and the second material are oxides.

6. The integrated MEMS transducer device according to claim 1, wherein the second material is an undoped silica glass.

7. The integrated MEMS transducer device according to claim 1, wherein the first material is at least one of a fluorinated silica glass or a silica glass.

8. The integrated MEMS transducer device according to claim 1, wherein a thickness of the sacrificial layer in a vertical direction, which is perpendicular to the surface of the substrate, is equal to or less than 3 μm.

9. The integrated MEMS transducer device according to claim 1, wherein a thickness of the sacrificial layer in a vertical direction, which is perpendicular to the surface of the substrate, is equal to or less than 1 μm.

10. The integrated MEMS transducer device according to claim 1, wherein the sacrificial layer further comprises a third sub-layer of a third material, and wherein the third material is different from the first and the second material or corresponds to the first material.

11. The integrated MEMS transducer device according to claim 1,
   wherein the substrate body comprises a cover layer; and
   wherein the surface is a surface of the cover layer.

12. The integrated MEMS transducer device according to claim 11, wherein the first electrode is arranged on a side of the cover layer that faces away from the substrate.

13. The integrated MEMS transducer device according to claim 1, wherein the anchor structure comprises vias or trenches configured for electrically interconnecting the second electrode with an active circuitry arranged on or within the substrate body.

14. The integrated MEMS transducer device according to claim 1, wherein the integrated MEMS transducer device further comprises a cap layer, the cap layer directly adjoining the second electrode and the etch stop layer.

15. A pressure sensor comprising:
   the integrated MEMS transducer device according to claim 1.

16. An electronic device comprising:
   the pressure sensor according to claim 15.

* * * * *